(12) United States Patent
Mercier et al.

(10) Patent No.: US 9,461,608 B2
(45) Date of Patent: Oct. 4, 2016

(54) RADIO FREQUENCY FILTER

(75) Inventors: Frederic Mercier, Saint Manvieu Norrey (FR); Luca Lococo, Anisy (FR); Vincent Rambeau, Cormelles le Royal (FR); Jean-Marc Paris, Benouville (FR)

(73) Assignee: NXP B.V., Austin, TX (US)

( * ) Notice: Subject to any disclaimer, the term of this patent is extended or adjusted under 35 U.S.C. 154(b) by 1323 days.

(21) Appl. No.: 12/529,740

(22) PCT Filed: Feb. 14, 2008

(86) PCT No.: PCT/IB2008/050540
§ 371 (c)(1),
(2), (4) Date: Sep. 3, 2009

(87) PCT Pub. No.: WO2008/107807
PCT Pub. Date: Sep. 12, 2008

(65) Prior Publication Data
US 2010/0090778 A1    Apr. 15, 2010

(30) Foreign Application Priority Data

Mar. 5, 2007   (EP) .................................... 07290292

(51) Int. Cl.
*H03H 7/01* (2006.01)
*H03H 7/12* (2006.01)
*H03J 3/20* (2006.01)
*H03H 7/38* (2006.01)

(52) U.S. Cl.
CPC ......... *H03H 7/0153* (2013.01); *H03H 7/1775* (2013.01); *H03J 3/20* (2013.01); *H03H 7/38* (2013.01); *H03H 2210/012* (2013.01); *H03H 2210/025* (2013.01); *H03H 2210/036* (2013.01); *H03J 2200/10* (2013.01)

(58) Field of Classification Search
USPC ........... 333/32, 174, 175; 455/213, 306, 307
See application file for complete search history.

(56) References Cited

U.S. PATENT DOCUMENTS 5,541,558 A * 7/1996 Weber et al. ................. 333/174
5,697,087 A * 12/1997 Miya et al. ................... 455/307
5,917,387 A   6/1999 Rice
(Continued)

FOREIGN PATENT DOCUMENTS

EP      0720299 A1   7/1996
EP      0841754 A2   5/1998
(Continued)

*Primary Examiner* — Robert Pascal
*Assistant Examiner* — Gerald Stevens

(57) ABSTRACT

A radio frequency filter (1) comprises an input impedance adaption section (2) and a tank capacitor section (3). Thereby, the capacity of the input impedance adaption section (2) does not comprise a fixed capacitor, it only comprises switchable capacitors. Further, the tank capacitor section (3) does not comprise a fixed capacitor as well it only comprises switchable capacitors. The capacity of the input impedance adaption section (2) can be tuned independent of the tank capacity, section capacity by means of switchable capacitors. Hence, bandwidth and frequency of the radio frequency filter can be modified independent of each other. The imput impedance adaption section (2) is connected in series between the input and output of the filter (1). The tank capacitor section (3) is shunt connected between the input-output series path of the filter (1) and ground. Optionally a gain/attenuation adaption section (4) is in series connected with the imput impedance adaption section (2) in the input-output path of the filter (1).

19 Claims, 1 Drawing Sheet

(56) References Cited

U.S. PATENT DOCUMENTS

| | | |
|---|---|---|
| 5,963,856 A | 10/1999 | Kim |
| 6,574,288 B1 | 6/2003 | Welland et al. |
| 6,707,403 B1 | 3/2004 | Hurrell |
| 6,992,543 B2 * | 1/2006 | Luetzelschwab et al. ...... 333/32 |
| 7,538,635 B2 * | 5/2009 | Fukuda et al. ................ 333/117 |
| 7,702,294 B2 * | 4/2010 | Granata .......................... 455/78 |
| 2002/0190887 A1 | 12/2002 | Takata et al. |
| 2004/0130414 A1 | 7/2004 | Marquardt |
| 2004/0235445 A1 | 11/2004 | Gomez |
| 2005/0184828 A1 * | 8/2005 | Son et al. ..................... 333/174 |
| 2007/0096842 A1 * | 5/2007 | Hyun et al. .................... 333/1.1 |

FOREIGN PATENT DOCUMENTS

| | | |
|---|---|---|
| EP | 1083657 A1 | 3/2001 |
| WO | 2004008490 A2 | 1/2004 |
| WO | 2005043678 A1 | 4/2006 |
| WO | 2006038190 A | 4/2006 |

* cited by examiner

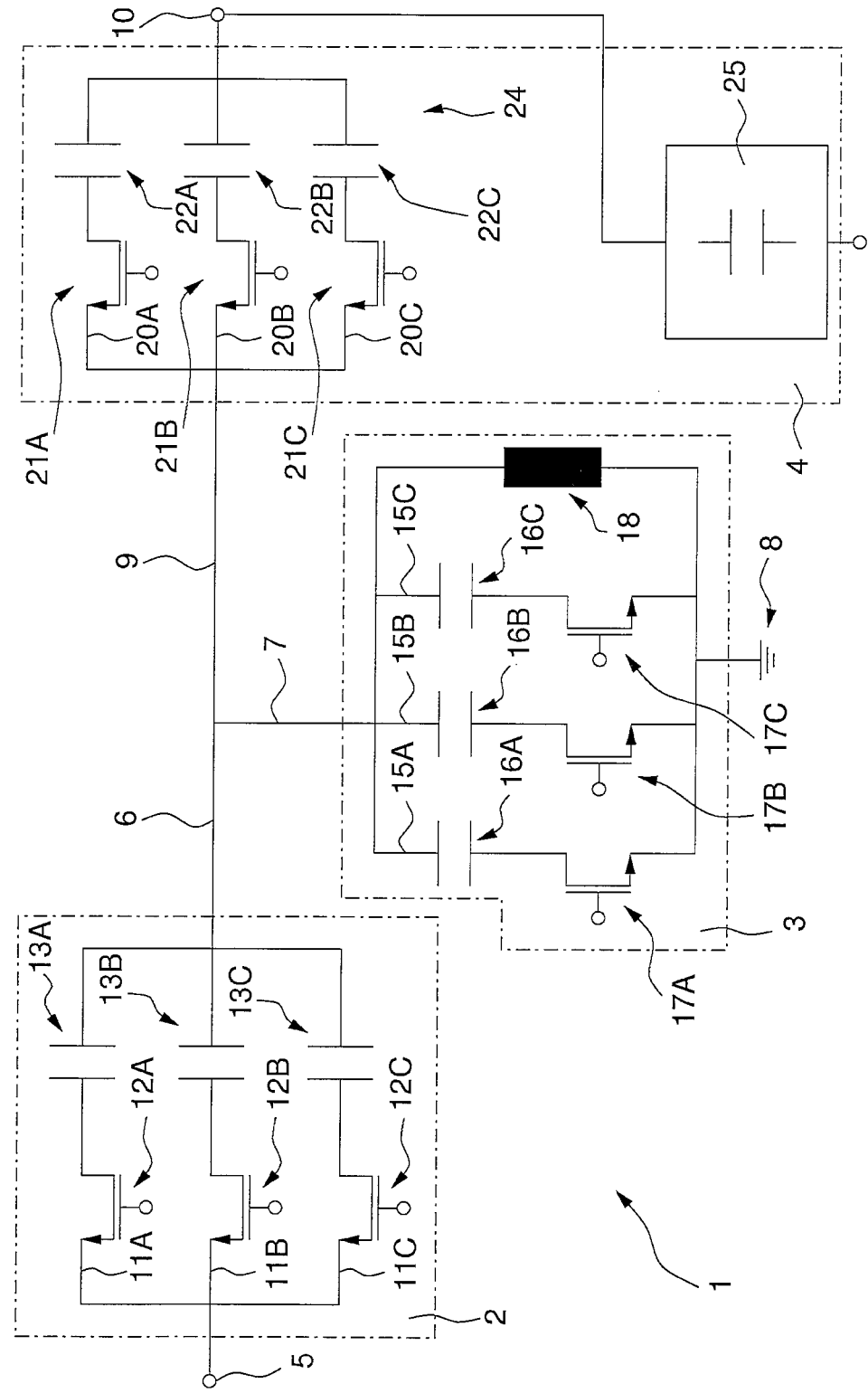

RADIO FREQUENCY FILTER

FIELD OF THE INVENTION

The present invention relates to a radio frequency filter. More particularly, the present invention relates to a radio frequency filter that is arranged as a radio frequency tracking filter and/or as a wide band filter.

BACKGROUND OF THE INVENTION

State of the art document US 2004/0235445 A1 describes a radio frequency tuner, which includes a programmable tracking filter bank receiving a radio frequency input and outputting a filtered radio frequency signal. Thereby, the programmable tracking filter bank comprises several branches, each of which consists of an impedance followed by a further impedance, a capacitor, and switchable capacitors connected parallel to each other to form a tank circuit. The outputs of the several branches are outputted through transistor switches, and are summed and outputted to a mixer stage. Thereby, each branch is tuned with respect to a center frequency, wherein the tunable filters are narrow band.

The radio frequency tuner known from US 2004/0235445 A1 has the disadvantage that input impedance is made with a fixed value impedance (coil). To cover a wide range, a large number of branches is required, and therefore the number of components is large. Especially, at least a coil is required for each branch of the programmable tracking filter. The cost of this solution is quite high.

OBJECT AND SUMMARY OF THE INVENTION

It is an object of the invention to provide a radio frequency filter with an improved performance.

This object is solved by a radio frequency filter as defined in claim 1.

Advantageous developments of the invention are mentioned in the dependent claims.

It is advantageous that the first branch comprises a field effect transistor, which is arranged to switch the switchable capacitor of the first branch of the input impedance adaption section, and that the second branch comprises a field effect transistor, which is arranged to switch the switchable capacitor of the second branch of the input impedance adaption section. Further, it is advantageous that each branch of the input impedance section comprises at least such a switchable capacitor and does not comprise a fixed capacitor. This has the advantage that the input impedance adaption section can be built up without coils so as to provide a solution that is low cost and can be integrated. Further, impedance adaption can be made over a wide range.

It is advantageous that the tank capacitor section comprises a first field effect transistor, which is connected in series with the first switchable capacitor of the tank capacitor section, and at least a second field effect transistor, which is connected in series with the second switchable capacitor of the tank capacitor section. Further, it is advantageous that the tank capacitor section does not comprise a fixed capacitor. Hence, the tank capacitor section can be built up with reduced costs compared to a varicap solution. Further, the global quality factor of adaptation impedence capacitors is different from global quality factor of tank capacitors. As a consequence, bandwidth of the radio frequency filter can be decorrelated from frequency. The capacity of the input impedance adaption section and the capacity of the tank capacitor section are selected so as to set that desired bandwidth and the desired frequency.

It is advantageous that an gain adaption section is provided. This gain adaptation section is comparable to a capacitor divider. This capacitor divider is composed of two parts. The first one comprises a first branch, which comprises at least a switchable capacitor, and at least a second branch, which comprises at least a switchable capacitor, wherein the output of the input impedance adaption section is connected via the first part of the gain adaption section with the second part of the gain adaptation section. The second part of the gain adaptation section can be constituted by an array of switched capacitors or by a fixed capacitor. This fixed capacitor could be part of the following block which is connected to the filter output. This arrangement has the advantage that the radio frequency filter can be used in a large number of applications. Thereby, it is advantageous that the first branch of the gain adaption section comprises a field effect transistor, which is arranged to switch the switchable capacitor of the first branch of the gain adaption section, and that the second branch of the gain adaption section comprises a field effect transistor, which is arranged to switch the switchable capacitor of the second branch of the gain adaptation section. The gain adaption section can be implemented with low costs and an integrated solution may be provided. Further, it is advantageous that the gain adaption section does not comprise a fixed capacitor so as to enable a large variation of the capacity of the output impedance adaption section.

The filter can be arranged as a radio frequency tracking filter and/or a wide band filter. For example, the band from approximately 50 MHz to approximately 550 MHz maybe split in two bands. A filter for one of these bands is a wide band filter so that decorrelating frequency from bandwidth is important. The cut-of frequency is at least nearly proportional to the sum of the capacity of the input impedance adaption section and the capacity of the tank capacitor section. Further, the bandwidth depends of the global capacitor quality factor. Hence, the bandwidth depends on the ratio of the capacity of the input impedance adaption section and the capacity of the tank capacitor section. Hence, the frequency and the bandwidth can be selected independent from each other. The number of discrete values for frequency and bandwidth depends on the number of branches of the input impedance adaption section and the number of branches of the tank capacitor section.

These and other aspects of the invention will be apparent from and elucidated with reference to the embodiments described hereinafter.

BRIEF DESCRIPTION OF THE DRAWING

The present invention will become readily understood from the following description of a preferred embodiment thereof made with reference to the accompanying drawing, in which:

FIG. 1 shows a schematic circuit diagram of a radio frequency filter according to an embodiment of the present invention.

DESCRIPTION OF EMBODIMENTS

FIG. 1 shows a circuit diagram of a radio frequency filter 1 according to an embodiment of the invention. The radio frequency filter 1 can be arranged as a radio frequency tracking filter and/or a wide band filter. One or more filters, which are arranged according to the radio frequency filter 1 as shown in FIG. 1, can be used in an apparatus such as a radio frequency receiver. But, the radio frequency filter 1 may also be used in other applications.

The radio frequency filter 1 comprises an input impedance adaption section 2, a tank capacitor section 3, and an gain adaption section 4. The input impedance adaption section 2 comprises an input 5, which is the input of the radio frequency filter 1. An output 6 of the input impedance adaption section 2 is connected with an input 7 of the tank capacitor section 3. Further, the tank capacitor section 3 is connected with an at least essentially fixed reference potential 8, which is a ground potential. Hence, the output 6 of the input impedance adaption section 2 is connected via the tank capacitor section 3 with the ground potential 8. Further, the output 6 of the input impedance adaption section 2 is also connected with an input 9 of the gain adaption section 4. Further, the gain adaption section 4 comprises an output 10, which is the output of the radio frequency filter 1.

The input impedance adaption section 2 comprises a first branch 11A, a second branch 11B, and a third branch 11C. The first branch 11A comprises a field effect transistor 12A and a switchable capacitor 13A, which is connected in series with the field effect transistor 12A. Hence, the field effect transistor 12A is arranged to switch the switchable capacitor 13A in and out. Further, the second branch 11B comprises a field effect transistor 12B, which is connected in series with a capacitor 13B of the second branch 11B. Accordingly, the third branch 11C comprises a field effect transistor 12C and a switchable capacitor 13C, which are connected in series. The input impedance adaption section 2 does not comprise a fixed capacitor, that is a capacitor that is not switchable. Hence, every capacitor 13A, 13B, 13C of the input impedance adaption section 2 can be switched with a field effect transistor 12A, 12B, 12C, respectively. The total capacity of the input impedance adaption section 2 depends on the actual setting of field effect transistors 12A, 12B, 12C.

The tank capacitor section 3 comprises a first branch 15A, a second branch 15B, and a third branch 15C. The first branch 15A of the tank capacitor section comprises a first switchable capacitor 16A and a first field effect transistor 17A, which are connected in series. Further, the second branch 15B of the tank capacitor section 3 comprises a second switchable capacitor 16B and a second field effect transistor 17B, which are connected in series. Further, the third branch 15C of the tank capacitor section 3 comprises a third switchable capacitor 16C and a third field effect transistor 17C, which are connected in series. Further, the tank capacitor section 3 comprises an impedance 18 which is a coil.

The total capacity of the tank capacitor section 3 depends on the actual states of first, second, and third field effect transistor 17A, 17B, 17C. It is noted that the tank capacitor section 3 comprises a coil and that the input impedance adaption section 2 does not comprise a coil or such. Further, the tank capacitor section 3 comprises switchable capacitors 16A, 16B, 16C in its branches 15A, 15B, 15C, respectively. But, the tank capacitor section 3 does not comprise a fixed capacity, which is a capacity that cannot be switched.

It is noted that both the capacity of the input impedance adaption section 2 and the capacity of the tank capacitor section 3 can be tuned from 0% to 100% so that each tunable capacitor realizes 100% of the possible capacity. A further advantage is that the input impedance adaption is not made with an inductive component, such as a coil, but with switched capacitance. Moreover, this capacitance is a part of the overall tank capacity. And, as the value of the capacity of the input impedance adaption section 2 is switchable, the radio frequency filter 1 offers the possibility to tune separately frequency and bandwidth. Thus, for the same value of the resonance frequency, which is given by the sum of the capacity of the input impedance adaption section 2 and the capacity of the tank capacitor section, different quality factors can be obtained. Due to the fact that the bandwidth depends on the quality factor, the bandwidth can be modulated without changing the frequency.

The gain adaption section 4 comprises a first part 24 comprising a first branch 20A, a second branch 20B, and a third branch 20C. The first branch 20A of the gain adaption section 4 comprises a field effect transistor 21A and a capacitor 22A, which are connected in series. Further, the second branch 20B of the gain adaption section 4 comprises a field effect transistor 21B and a capacitor 22B, which are connected in series. And, the third branch 20C of the gain adaption section 4 comprises a field effect transistor 21C and a capacitor 22C, which are connected in series. Hence, the capacitor 22A, the capacitor 22B, and the capacitor 22C are switchable capacitors 22A, 22B, 22C, respectively. Therefore, the gain adaption section 4 comprises switchable capacitors 22A, 22B, 22C and does not comprise a fixed capacitor. Hence, the capacity of the first part 24 of the gain adaption section 4 can be tuned from 0% to 100% of the possible capacity of the first part 24 of the gain adaption section 4.

Further, the gain adaptation section 4 comprises a second part 25. The second part 25 may be a part of the radio frequency filter 1 or may be a part of the following block which is connected to the filter output 10, as shown in FIG. 1. The second part 25 comprises at least a fixed capacitor, a switched capacitor, an array of switched capacitors or such.

Although an exemplary embodiment of the invention has been disclosed, it will be apparent to those skilled in the art that various changes and modifications can be made which will achieve some of the advantages of the invention without departing from the spirit and scope of the invention. Such modifications to the inventive concept are intended to be covered by the appended claims in which the reference signs shall not be construed as limiting the scope of the invention. Further, in the description and the appended claims the meaning of "comprising" is not to be understood as excluding other elements or steps. Further, "a" or "an" does not exclude a plurality, and a single processor or other unit may fulfill the functions of several means recited in the claims.

The invention claimed is:

1. A radio frequency filter, for at least a frequency band, comprising:
an input impedance adaption section including a first branch having at least a switchable capacitor and at least a second branch having at least a switchable capacitor, each of the first and second branches electrically coupled in parallel to an intermediate node; and
a tank capacitor section consisting of circuitry configured and arranged to provide an overall impedance between the intermediate node and a reference node that consists of reactance, the tank capacitor section including a coil in parallel with a switchable capacitive circuit having a first switchable capacitor and at least a second switchable capacitor, the coil and the switchable capacitive circuit being configured and arranged between the intermediate node and the reference node for providing a current path between the intermediate node and the reference node, wherein at least one of the input impedance adaption section and the tank capacitor section is configured and arranged to provide a plurality of selectable capacitance levels including zero capacitance; and a gain adaption section including a first branch having at least a switchable capacitor and at least a second branch having at least a switchable capacitor, each of the first and second branches thereof electrically coupled in parallel to the intermediate node, and wherein current at the intermediate node is electrically isolated from the reference node by both the input impedance adaption section and the gain adaption section.

2. The radio frequency filter according to claim 1, wherein the first branch includes a field effect transistor configured and arranged to switch the switchable capacitor of the first branch, and that the second branch includes a field effect transistor-configured and arranged to switch the switchable capacitor of the second branch.

3. The radio frequency filter according to claim 1, wherein the tank capacitor section includes a first field effect transistor-connected in series with the first switchable capacitor of the tank capacitor section, and at least a second field effect transistor-connected in series with the second switchable capacitor of the tank capacitor section.

4. The radio frequency filter according to claim 1, wherein each of the first and the at least second branches of the input impedance adaption section comprises at least a switchable capacitor which is not in parallel with a fixed capacitor.

5. The radio frequency filter according to claim 1, wherein the tank capacitor section is not in parallel with a fixed capacitor.

6. The radio frequency filter according to claim 1, wherein an output of the input impedance adaption section is connected via a part of the gain adaption section with an output of the radio frequency filter.

7. The radio frequency filter according to claim 6, wherein the first branch of the gain adaption section includes a field effect transistor configured and arranged to switch the switchable capacitor of the first branch of the gain adaption section, and the second branch of the gain adaption section includes a field effect transistor configured and arranged to switch the switchable capacitor of the second branch of the gain adaption section.

8. The radio frequency filter according to claim 6, wherein each branch of the part of the gain adaption section includes at least a switchable capacitor which is not in parallel with a fixed capacitor.

9. The radio frequency filter according to claim 1, wherein the reference node is connected to ground.

10. The radio frequency filter according to claim 1, wherein the radio frequency filter is arranged as a radio frequency tracking filter.

11. The radio frequency filter according to claim 1, wherein the radio frequency filter is arranged as a wide band filter.

12. The radio frequency filter according to claim 1, wherein the reference node is connected to a reference potential that is at least essentially fixed.

13. The radio frequency filter according to claim 1, wherein each branch of the input impedance adaption section and the tank capacitor section comprises at least a switchable capacitor which is not in parallel with a fixed capacitor.

14. The radio frequency filter according to claim 1, wherein the switchable capacitors contained in the at least one of the input impedance adaption section and the tank capacitor section are tunable from 0% to 100% of a capacity of the switchable capacitors.

15. The radio frequency filter according to claim 1, wherein the gain adaption section includes a first portion configured to be tuned from 0% to 100% of a capacity of the first portion of the gain adaption section.

16. The radio frequency filter according to claim 1, wherein the capacitance of the input impedance section is switchable to tune separately frequency and bandwidth.

17. The radio frequency filter according to claim 16, wherein the bandwidth is modulated independent of the frequency.

18. A radio frequency filter comprising:
a tank capacitor circuit consisting of circuitry configured and arranged to provide an overall impedance between an intermediate node and a reference node that consists of reactance, the tank capacitor circuit configured and arranged to provide a plurality of selectable capacitance levels including zero capacitance, the tank capacitor circuit including a coil in parallel with a switchable capacitive circuit having a first switchable capacitor and at least a second switchable capacitor;

an input impedance adaption circuit configured and arranged to provide a plurality of selectable capacitance levels including zero capacitance, the input impedance adaption circuit including a first branch having at least a switchable capacitor and at least a second branch having at least a switchable capacitor and an output connected via the tank capacitor circuit with a reference potential, each of the first and second branches electrically coupled in parallel to the intermediate node; and a gain adaption circuit including a first portion configured and arranged to be tuned from 0% to 100% of a total capacitance capacity of the first portion, the gain adaptation circuit being connected to the intermediate node, wherein current at the intermediate node is electrically isolated from the reference node by both the input impedance adaption section and the gain adaption circuit.

19. The radio frequency filter according to claim 18, wherein the switchable capacitors contained in the at least one of the input impedance adaption circuit and the tank capacitor circuit are tunable from 0% to 100% of a capacity of the switchable capacitors.

* * * * *